US012588157B2

(12) United States Patent
Fotherby

(10) Patent No.: US 12,588,157 B2
(45) Date of Patent: Mar. 24, 2026

(54) MODULAR POWER SYSTEM

(71) Applicant: Power Concepts NZ Limited,
Auckland (NZ)

(72) Inventor: Christopher William Fotherby,
Auckland (NZ)

( * ) Notice: Subject to any disclaimer, the term of this
patent is extended or adjusted under 35
U.S.C. 154(b) by 303 days.

(21) Appl. No.: 18/504,519

(22) Filed: Nov. 8, 2023

(65) Prior Publication Data
US 2025/0151223 A1 May 8, 2025

(51) Int. Cl.
*H05K 7/14* (2006.01)
*H02B 1/46* (2006.01)
*H05K 7/02* (2006.01)

(52) U.S. Cl.
CPC .............. *H05K 7/026* (2013.01); *H02B 1/46*
(2013.01); *H05K 7/14324* (2022.08); *H05K*
*7/1457* (2013.01)

(58) Field of Classification Search
CPC .. H05K 7/026; H05K 7/14324; H05K 7/1457;
H02B 1/46; H01M 10/4207; H01M
10/4257; H01M 50/249; H01M 50/258;
H01M 50/269; H01M 50/502; H01M
2010/4271; H01M 2220/20; H02J 1/001
See application file for complete search history.

(56) References Cited

U.S. PATENT DOCUMENTS

| | | | | | |
|---|---|---|---|---|---|
| 8,587,150 | B2 * | 11/2013 | Parakulam | .............. | H02J 1/102 |
| | | | | | 320/138 |
| 8,676,393 | B1 * | 3/2014 | Hupton | ...................... | H02J 3/14 |
| | | | | | 700/291 |

| | | | | | |
|---|---|---|---|---|---|
| 11,581,588 | B2 * | 2/2023 | Zhong | ................. | H01M 10/425 |
| 2004/0168818 | A1 * | 9/2004 | Layden | ................. | H02J 7/0031 |
| | | | | | 174/50 |
| 2015/0116913 | A1 * | 4/2015 | Kwon | ................. | H05K 7/1492 |
| | | | | | 361/624 |
| 2016/0043555 | A1 * | 2/2016 | Howell | ................. | H02J 7/0068 |
| | | | | | 307/23 |

(Continued)

FOREIGN PATENT DOCUMENTS

| | | |
|---|---|---|
| EP | 3605772 A1 | 2/2020 |
| EP | 3893289 A1 | 10/2021 |

(Continued)

OTHER PUBLICATIONS

Combined Search and Examination Report under Sections 17 and
18(3) issued for United Kingdom Patent Application GB2216671.4,
on Jan. 12, 2023, 07 Pages.

*Primary Examiner* — Robert J Hoffberg
(74) *Attorney, Agent, or Firm* — RC Trademark Company

(57) ABSTRACT

Disclosed is a modular power system. The modular power
system comprises a high current backplane for providing
electrical connections, the high current backplane comprises
a plurality of slots wherein each slot is configured to receive
a power module from a plurality of power modules, and
wherein a power module of the plurality of power modules
can be removably coupled to a slot of the plurality of slots;
and at least one memory device configured to store configu-
ration data for one or more of the plurality of power
modules, wherein each power module of the plurality of
power modules comprises a processor operatively coupled
with the at least one memory device to employ the configu-
ration data for a desired operation of the modular power
system.

20 Claims, 5 Drawing Sheets

(56) References Cited

U.S. PATENT DOCUMENTS

| | | | | |
|---|---|---|---|---|
| 2016/0093843 A1* | 3/2016 | Reineccius | ....... | H01M 10/4257 |
| | | | | 429/61 |
| 2016/0211698 A1 | 7/2016 | Nandam et al. | | |
| 2020/0042062 A1* | 2/2020 | Astefanous | ........... | H02J 7/0068 |

FOREIGN PATENT DOCUMENTS

| | | |
|---|---|---|
| WO | WO2016049358 A1 | 3/2016 |
| WO | WO2018035608 A1 | 3/2018 |

* cited by examiner

MODULAR POWER SYSTEM

TECHNICAL FIELD

The present disclosure relates to a modular power system; and more specifically, to a configurable modular power system.

BACKGROUND

There are many situations where electrical power is required at locations that don't have a permanent connection to an electrical grid. Where only a small amount of electrical power is required, it is common practice to provide the power as a direct current (DC) voltage from a storage battery that is charged from an engine driven 12 or 24 VDC alternator, solar panels, and/or a wind charger. Higher power systems will normally include alternating current (AC) electrical appliances, typically operating at 115V 60 Hz or 230V 50 Hz. A non-exhaustive list of locations where AC electrical power is required include: boats, recreational vehicles, off-grid houses, remote offices, and remote tourist lodges. For the last century locations like these have commonly been provided with electrical power from an AC generator driven by an internal combustion engine. For about the last 30 years it has been possible to augment the generator systems with a DC to AC inverter supplied from a storage battery. During periods of low power demand, the generator can be shut down and the AC loads supplied from the inverter. Augmented systems like this have been particularly popular on recreational boats so that the generator can be shut down overnight while people are sleeping. The inverter/battery systems have been getting increasingly more sophisticated with, for instance, the introduction of inverter-chargers that are able to charge the storage battery when the generator is running. or when a boat is connected to an electrical grid via a shore-power connection. Many inverter-chargers also have AC transfer switches built in that can automatically power the AC loads from either the generator, the shore power connection, or the AC output from the inverter, depending on which sources actually have power available at any particular time. Systems can also be built from separate inverter, charger, and transfer switch units. The transfer switch will normally be programmable so that the power sources can be ordered in terms of the priority of which source should be used under specific conditions, and how long that power source should be present for before the switch can select it. Other units that may be added to increase the functionality of these systems include battery state-of-charge monitors, and alternator controllers that can control the charging current into the storage battery from alternators mounted on the main engine(s) of a boat or recreational vehicle. There are many different types of storage batteries that could be used. Some common ones are: flooded lead acid, Absorbent Glass Mat lead acid, and a number of lithium-ion chemistries. Each type of battery requires a number of parameters to be configured in the inverter-charger and alternator controller so that the battery is charged correctly and safely.

A sophisticated inverter/charger/storage battery system will often need to be designed by a skilled system designer who can select from the many inverter, inverter-charger, charger, alternator controller, and storage batteries on the market in order to meet the operational requirements of the system. The individual components will then need to be connected together using power and communications cables. At the higher power levels for these types of systems the power cables can become quite thick, unwieldy, and expensive, especially for systems that use a 12 or 24 VDC storage battery. The individual components will also need to have their configuration parameters set correctly. For instance, the various sources that can charge the battery need to have their charging profile set to match the particular battery chemistry being used. In addition, the inverter, inverter-charger, battery state-of-charge monitor, and alternator controller will all have other configuration parameters that will need to be set in order for the assembled system to function as the system designer intended.

The systems described above may be called modular power systems in that they are assembled from separate components each of which performs one, or a small number of functions. However, in the present disclosure the term "modular power system" will be used to describe a system where each component is a module that is designed to work specifically with other modules of the system and to be easily assembled together with other modules to form a complete system.

A company like a boat-builder or a recreational vehicle (RV) manufacturer must work out a way of handling the case where the same component must be configured differently for different models of boats or RVs. One option is for the components to be configured before they are installed and then a great deal of care taken to ensure that all the components installed in a particular boat or RV have been correctly configured for that boat or RV. A second option is for un-configured components to be installed and for them to be configured at a subsequent stage of the production line by a skilled person. The first option is likely to lead to components being installed with the wrong configuration that must then be corrected at the end of the production line or when the customer receives their boat or RV. The second option adds an extra stage to the production line, and this stage would take a significant amount of time and couldn't be performed by the un-skilled or semi-skilled labour that is normally used for production line work, which are all things that manufacturers strive to eliminate from their production lines. A further problem for a system consisting of a number of components that each stores its configuration internally occurs when a component fails and needs to be replaced in the field. The technician replacing the component needs to know what it's configuration setting should be and how to enter them into the component. This means that the technician needs to be trained to service the component that has failed, which can be particularly problematic if the system has been assembled using components from more than one manufacturer.

Therefore, in light of the foregoing discussion, there exists a need to overcome the aforementioned drawbacks associated with existing power systems and provide an improved modular power system.

SUMMARY

The present disclosure seeks to provide a modular power system. An aim of the present disclosure is to provide a solution that overcomes at least partially the problems encountered in prior art. The present disclosure seeks to provide a modular power system having a simple design with a high reliability backplane that has a minimum of electronic components, especially integrated circuits, therewith to provide a low probability of failure during operation. The present disclosure also seeks to provide a quick and easy way to integrate different components of a power system and retain the configuration information for future use.

The modular power system is enabled to minimize the number of electrical connections between the plurality of power modules and the high reliability backplane, such that robust connectors may be used. Such a configuration allows the power modules to be quickly and accurately assembled into the backplane even by unskilled labour and thus reduces the manufacturing costs. Further, the modular power system facilitates easy servicing in the field. Simply swapping a faulty module for a working module can restore a system to full functionality without the need to enter any configuration settings into the working module, thus reducing the repair time and the maintenance costs of the modular power system.

In one aspect, the present disclosure provides a modular power system comprising:

a high current backplane for providing electrical connections, the high current backplane comprising:

a plurality of slots wherein each slot is configured to receive a power module from a plurality of power modules, and wherein a power module of the plurality of power modules can be removably coupled to a slot of the plurality of slots; and at least one memory device configured to store configuration data for one or more of the plurality of power modules, wherein each power module of the plurality of power modules comprises a processor operatively coupled with the at least one memory device to employ the configuration data for a desired operation of the modular power system.

In an embodiment, each slot of the plurality of slots comprises at least one memory device.

In another embodiment, one or more of the at least one memory devices comprises at least a slot identifier.

In an embodiment, the at least one memory device comprises a slot compatibility data, and wherein each processor is configured to determine whether the power module containing the processor is coupled to a compatible slot based on the slot compatibility data.

In another embodiment, the processor is configured to generate an error alert when the power module containing the processor is not coupled to a compatible slot.

In an embodiment, the processor is configured to generate an error alert when the configuration data in the at least one memory device that is intended for the slot that the power module containing the processor is coupled to is not suitable for the type of power module containing the processor.

In an embodiment, the plurality of power modules coupled to the plurality of slots comprises one or more battery modules, zero or more inverter modules, and zero or more charging modules.

In an embodiment, the high current backplane further comprises a plurality of connectors, located in or near each slot of the plurality of slots, configured to connect to a mating connector on a power module of the plurality of power modules and enabling electrical signals to be communicated to and from each of the plurality of power modules.

In another embodiment, the plurality of connectors is further configured to enable a power module of the plurality of power modules coupled to a slot of the plurality of slots to communicate with other power modules of the plurality of power modules coupled to other slots of the plurality of slots.

In another embodiment, the plurality of connectors is further configured to enable the processor contained in each of the plurality of power modules to access the at least one memory device.

In an embodiment, each of the plurality of connectors comprises a blind-mate connector system, wherein the blind mate connector system comprises:

a first part attached to a power module of the plurality of power modules; and a second part attached to the high current backplane; and wherein one or both of the first part or the second part comprises one or more angled guides adapted to align the first part with respect to the second part or vice versa, as the power module is inserted into the high current backplane.

Additional aspects, advantages, features, and objects of the present disclosure will be made apparent from the drawings and the detailed description of the illustrative embodiments construed in conjunction with the appended claims that follow.

It will be appreciated that features of the present disclosure are susceptible to being combined in various combinations without departing from the scope of the present disclosure as defined by the appended claims.

BRIEF DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and instrumentalities disclosed herein. Moreover, those skilled in the art will understand that the drawings are not to scale. Wherever possible, like elements have been indicated by identical numbers.

Embodiments of the present disclosure will now be described, by way of example only, with reference to the following diagrams wherein.

Figure 1:
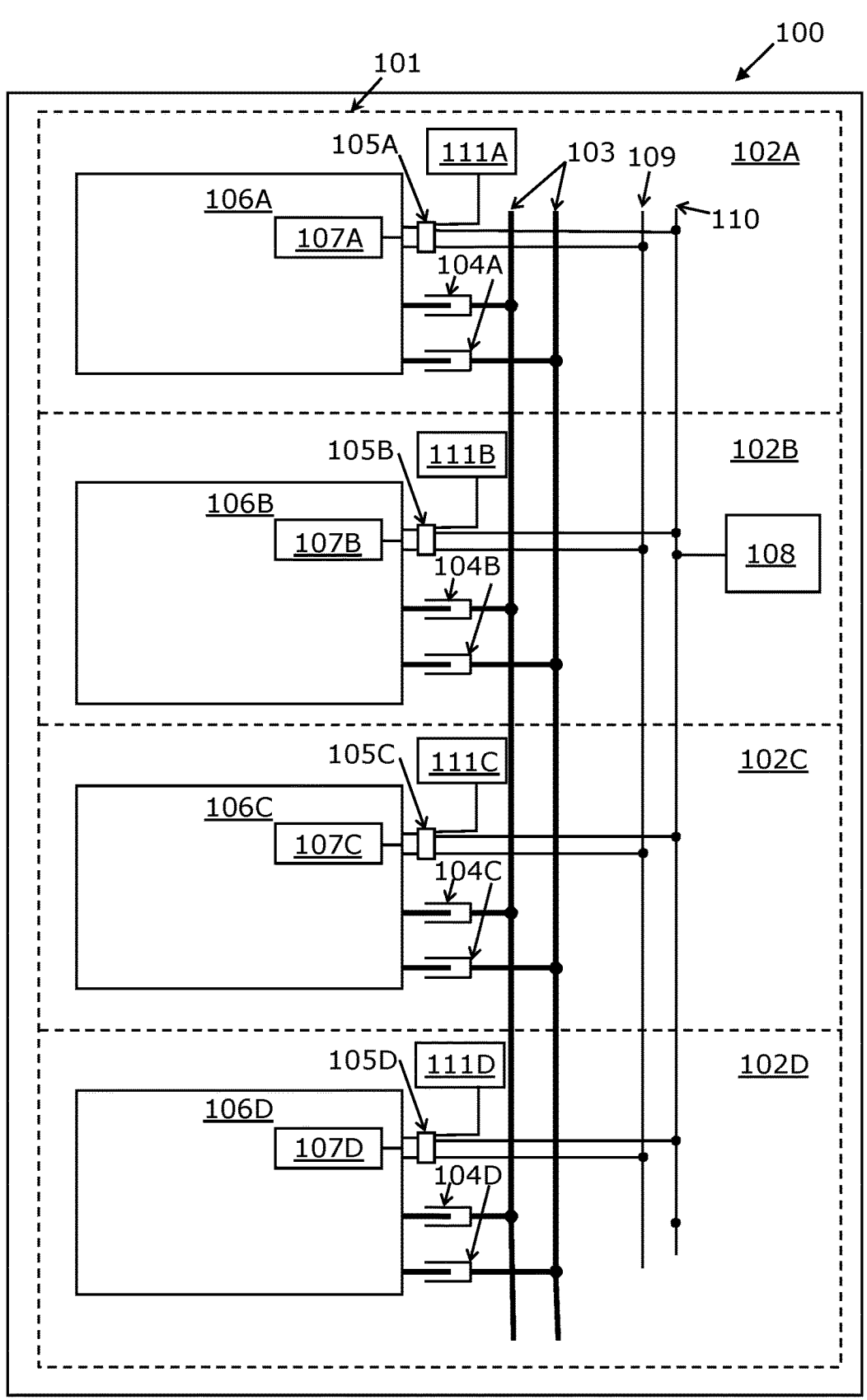
FIG. 1 is an exemplary illustration of a modular power system, in accordance with an embodiment of the present disclosure.

In the accompanying drawings, an underlined number is used to label an item represented by a rectangular box. If the box contains other items, then the labelled item will consist of all these items taken together. The underlined number is positioned immediately inside the box it refers to. A non-underlined number relates to an item identified by an arrow linking the non-underlined number to the item. The item identified by the arrow may be an empty box, a box containing other items, or a diagrammatic representation of a physical object.

DETAILED DESCRIPTION OF EMBODIMENTS

The following detailed description illustrates embodiments of the present disclosure and ways in which they can be implemented. Although some modes of carrying out the present disclosure have been disclosed, those skilled in the art would recognize that other embodiments for carrying out or practising the present disclosure are also possible.

In an aspect, the present disclosure provides a modular power system comprising:

a high current backplane for providing electrical connections, the high current backplane comprising:

a plurality of slots configured to receive a set of power modules, wherein each power module of the set of power modules is removably coupled to a slot of the plurality of slots; and at least one memory device configured to store configuration data for the set of power modules, wherein each power module in the set of power modules comprises a processor operatively coupled with the at least one memory device to employ the configuration data for a desired operation of the set of power modules.

The modular power system overcomes at least partially the requirement for highly skilled power system experts to create or set-up and/or maintain a functioning power system and thus reduces the cost of installation, maintenance, and future repairs. Further, the modular power system eliminates the need for heavy power cables to be fabricated specifically to suit the individual components that have been selected to create a power system, and provides a compact and efficient configuration. Moreover, the modular power system eliminates the need for other electrical components of the modular power system to be re-configured when and if any power module is to be replaced and ensures compatibility and efficient operation.

Beneficially, the modular power system also allows the set of power modules to be swapped in and out for servicing or repair without the need to configure the new power modules. Additionally, each of the set of power modules of the modular power system is able to verify that it has been plugged into a compatible slot, which allows errors made when loading modules into slots in the backplane to be easily detected, thereby making the installation process faster and easier.

The modular power system comprises a high current backplane for providing electrical connections for both power circuits and signalling circuits. The backplane is configured to serve as the backbone of the modular power system and enables inter-connection with several types of modules using connections (such as, but not limited to, plug-in connectors) to form the complete modular power system, wherein these modules (or power modules) are configured with connectors that will mate with the corresponding connectors of the backplane, where some connectors are used to transfer power between modules and some are used for signalling circuits that allow power modules to communicate with each other, with memory devices mounted on or otherwise associated with the high current backplane, and also with systems external to the modular power system. The "high current" designation for the backplane refers to its ability to transfer power between modules. For instance, from a number of battery modules to an inverter module. The amount of current that has to be handled in order to transfer a certain amount of power is proportional to that power and inversely proportional to the voltage at which the power transfer section of the high current backplane operates. For instance, an inverter that received 10 kW from the backplane would be drawing 208 A from a backplane operating at 48 VDC or 417 A from one operating at 24 VDC. Plug-in connectors capable of handling hundreds of amps must be carefully designed so that they do not overheat. If the current is too high to be easily handled by a single connector, then two or more connectors can be used in parallel.

The high current backplane comprises a plurality of slots configured to receive a set of power modules, wherein each power module is removably coupled to a slot of the plurality of slots. The "slot" refers to an empty space configured for receiving a single power module. Typically, the high current backplane is configured to provide electric connections to the plurality of slots i.e., between each of the plurality of power modules and the high current backplane. In operation, the high current backplane comprises the plurality of slots configured to receive the plurality of power modules, wherein each power module of the plurality of power modules is removably coupled to a slot of the plurality of slots. Herein, the slot may refer to a compatible slot or a slot pre-configured to accommodate a specific type of power module. For example, a slot of the plurality of slots may have an associated memory device that contains configuration data for an inverter module, so that only an inverter module should be plugged into that slot. Further, some slots may have only a single set of connectors for the power connection while other slots may have two or more sets connected in parallel, such that a power module that requires two sets of power connectors connected in parallel in order to be able to draw its operating current from the backplane would not be compatible with any slots that only provided one set of power connectors.

In an embodiment, the plurality of power modules comprises one or more battery modules, zero or more inverter modules, and zero or more charging modules. It will be appreciated that the power modules may be selected from any one of the battery module, inverter module, and charging module, or at least the battery module, or none of them. In an example, the plurality of power modules comprises one battery module only. In another example, the plurality of power modules comprises one inverter module and two battery modules.

In an embodiment, the high current backplane further comprises a plurality of connectors, located in or near each slot of the plurality of slots, configured to connect to a mating connector on a power module of the plurality of power modules and enable electrical signals to be communicated to and from each of the plurality of power modules. Typically, the plurality of connectors that are located in or near each of the plurality of slots are configured to further connect to a mating connector i.e., located on a power module from amongst the plurality of power modules and enable electrical communication therefrom.

In an embodiment, each slot of the plurality of slots comprises a connector, and wherein the connector is configured to connect with a mating connector of the power module coupled to the slot to enable electrical communication. Notably, such a connection enables the plurality of power modules to communicate with each other. The use of a connector enables a clean connection between each slot of the plurality of slots and the power module of the plurality of power modules to be maintained. This also helps to achieve the plug-in and unplug functionality between the slots and the power modules and removes the need to make complex wiring connections between the slot and the power module.

In another embodiment, the plurality of connectors are further configured to enable the processor contained in each of the plurality of power modules to access the at least one memory device. This enables the processor to access data (such as the configuration data or the slot-compatibility data) in the at least one memory device for further operation.

In an embodiment, some or all of the plurality of connectors comprises a blind-mate connector system. Due to unavoidable tolerances in the mechanical parts of the module and the backplane, especially in the mechanism that guides the module into the backplane, the two parts of the connector are unlikely to be perfectly aligned when they first engage with each other. The first part and/or the second part of the blind mate connector system comprises one or more angled guides adapted to align the first part with respect to the second part, as the power module is inserted into the slot. One or both parts are able to move sideways with respect to the other part and the one or more angled guides move the two parts into alignment before the electrical contact pins start engaging with each other. The angled guides ensure the smooth fit between the first part and the second part of the blind mate connector system, and thus greatly reduces the possibility of the connectors being damaged when the module is inserted into the slot. Notably, each of the two halves are designed to reliably mate although the person sliding the module into the slot is unable to see the connectors. Beneficially, no skill is required to engage them, thus they may be installed in the field by relatively unskilled workers and thereby reducing the associated operational costs. As it is hard to make blind mate connectors work reliably when they have a large number of pins, reasonable care is taken to minimise the number of electrical signals required to be coupled from the power modules to the backplane. In an exemplary scenario, memory devices are used on the backplane that communicate using a serial data protocol rather than using parallel address and data signals.

The high current backplane comprises at least one memory device configured to store configuration data for the plurality of power modules. The memory device is preferably a non-volatile memory such as an Electrically Erasable Programmable Read Only Memory (EEPROM) or similar device so that it can store the configuration data when there is no electrical power available. The "configuration data" refers to a type of setup data i.e., a set of instructions or statements providing instructions for the operation of the power module to perform the specified operation or function. The configuration data for each of the plurality of power modules may comprise values relating to current input, current output, voltage input, voltage output, current input type, current output type and the like. Typically, storing the configuration data in the at least one memory device allows the plurality of power modules to work in a plug and play manner. In other words, the plurality of power modules may be shipped from the factory without any pre-configuration and can access the at least one memory device of the high current backplane for the configuration data needed for that particular installation. Beneficially, this removes the need to pre-load each power module with the specific configuration data needed for each installation, or to configure the power modules at the time of installation, making the entire installation process faster and easier. Further, any modular power system manufacturer may supply a stock of power modules and backplanes to a customer, wherein the backplanes are programmed for a variety of types of systems. When the customer has to install a particular type of system, they can select the correct backplane and load the associated power modules from their stock, without having to spend any time configuring the power modules. Further, even if the backplanes are not pre-programmed by the modular power system manufacturer, the customer may program them themselves before sending them to their production line and then only has to ensure that the correct rack has been installed to guarantee that all the power modules will receive their correct configuration data. This saves installation time and associated costs.

In an embodiment, the high current backplane comprises one memory device which contains the configuration data for every slot in the plurality of slots, wherein the processor in each of the plurality of power modules is able to read the configuration data for the slot that the power module is coupled to. In this embodiment, the processor is required to determine which slot it is coupled to, which is independent of the one memory device such that the processor may further determine the set of configuration data in the one memory device intended for the slot that its power module is coupled to.

In another embodiment, each slot comprises a memory device that holds the configuration data for the slot that the memory device is associated with. Each of the memory devices comprises at least a slot identifier, wherein the slot identifier is configured to identify the slot from the plurality of slots that the memory device is associated with. In this embodiment the slot identifier is useful in, for instance, sequencing the module-to-module communications between each of the modules in the modular power system, identifying which module is faulty when performing remote diagnostics on a system, and many other operations that involve communicating with or monitoring the modules in a system. The memory device may be associated with a slot by being physically connected to the slot, with the necessary electrical connections between the memory device and the processor in the module coupled to a slot being made by a plug-in connector with one part of the connector attached to the backplane and the mating part attached to the module. A second method of associating a memory device with a slot is to have a plug-in memory device with a number or symbol marked on it, and numbers or symbols marked on or adjacent to the slots in the backplane. A memory could then be plugged into the module that is coupled to the slot that has a number or symbol that matches the one on the memory. However, the second method has considerable disadvantages, such as a memory device being plugged into a module that is coupled to a slot other than the one marked on the memory device, or the memory device being left in a module being returned for service such that no configuration data is available during installation of a new module.

Those skilled in the art will appreciate that the number of memory devices connected to each of the plurality of slots may vary depending upon the implementation without limiting the scope of this disclosure. For example, it would be possible to have one memory device shared between two slots, but this would just be a different implementation and would not add novelty to the teachings of this disclosure.

Further, the high current backplane comprises the plurality of power modules, wherein a power module comprises a processor operatively coupled with the at least one memory device to employ the configuration data for a desired operation of the power module i.e., utilize the configuration data and thereby enable the power module to perform a specified operation. In operation, the processor is configured to communicate with the at least one memory device to perform the specified operation. The specified operation refers to one of the electrical applications of the modular power system and is dependent upon the nature or type of the power module containing the processor. Typically, different types of power modules of the plurality of power modules perform different operations.

In an embodiment, the at least one memory device comprises slot compatibility data, wherein each processor is configured to determine whether the power module containing the processor is coupled to a correct slot based on the slot compatibility data. Herein, the term "correct slot" refers to a compatible and/or a pre-configured slot operable to receive the power module. Herein, the processor utilizes the slot compatibility data fetched from the at least one memory device, based on which the processor is configured to determine whether the power module containing the processor is coupled to a correct slot or not. Alternatively stated, the configuration data is configured to enable the processor to determine whether the power module coupled to the slot is compatible or not. In an example, the slot compatibility data states that the concerned slot is compatible with only an inverter type power module. Thus, the slot compatibility data eliminate the need for highly skilled power system experts to connect the power module of the plurality of power modules with the slot of the plurality of slots.

In another embodiment, the processor is configured to generate an error alert when the power module containing the processor is not coupled to a compatible slot. Typically, the processor is configured to utilise the slot compatibility data from the at least one memory device and determine whether the power module containing the processor is connected to a compatible slot or not, and thereby enable detection of any incompatibility issues during connection of the power modules with the respective slots, or as soon as the system is powered on. As a result, when the power module is not coupled to a compatible, the processor is configured to generate an error alert.

In an embodiment, each of the set of power modules comprises a processor, a processor memory that may be internal to or external to the processor, and an error generation module. The processor memory comprises non-volatile memory (e.g., flash memory, read-only memory, electrically erasable programmable read-only memory, etc.) for storing executable instructions and data, and so-called random-access memory (e.g., static random-access memory, or dynamic random-access memory) for storing variables used during program execution. The configuration data enables the processor to identify what type of power module the configuration data is intended for and characteristics of the slot such as how many power connectors it has and therefore how much current it can supply. Thus, the processor can verify whether the slot is compatible with the power module that contains the processor. If a power module connected to a slot is incompatible, the error generation module is configured to generate an error alert indicating an incompatible connection with the associated slot. In an embodiment, the error generation module of the power module generates an error alert, wherein the error alert is in the form of an audible cue, visual cue, or both.

DETAILED DESCRIPTION OF THE DRAWINGS

The following detailed description illustrates embodiments of the present disclosure and ways in which they can be implemented. Although some modes of carrying out the present disclosure have been disclosed, those skilled in the art would recognize that other embodiments for carrying out or practising the present disclosure are also possible. The following detailed descriptions for FIGS. 1, 2, and 7 reference slot 102A from the plurality of slots 102A-102D when a specific slot needs to be referenced, and also reference items that are associated with slot 102A, such as power module 106A, processor 107A, memory device 208A, and data 301A. Those skilled in the art will recognize that the same description can be applied in turn to each of the slots 102B, 102C, and 102D, by suitably changing the suffix letter after each identification number in the description.

FIG. 1 is an exemplary illustration of a modular power system 100, in accordance with an embodiment of the present disclosure. As shown, the modular power system 100 comprises a high current backplane 101 for providing electrical connections, wherein the high current backplane 101 comprises a plurality of slots 102A-102D configured to receive a plurality of power modules 106A-106D, wherein each power module of the plurality of power modules 106A-106D is removably coupled to a slot of the plurality of slots 102A-102D. Further shown, the high current backplane 101 comprises at least two high current conductors 103, interconnecting each slot of the plurality of slots 102A-102D. Further shown. the high current backplane 101 comprises a plurality of connectors 104A-104D from power modules 106A-106D to the at least two high current conductors 103. The high current backplane 101 further comprises at least one memory device 108 configured to store configuration data for the plurality of power modules 106A-106D. and wherein power module 106A comprises a processor 107A. wherein processor 107A is operatively coupled with the at least one memory device 108 to employ the configuration data for a desired operation of power module 106A. Further shown, the high current backplane 101 comprises at least one first electrical signal conductor 109 to enable electrical signals to be communicated to and from each power module of the plurality of power modules 106A-106D. Further shown, the high current backplane 101 comprises at least one second electrical signal conductor 110 for connecting the at least one memory device 108 to the processors 107A-107D. Further shown, slot 102A comprises a slot identifier 111A. wherein the slot identifier 111A has electrical connections that are adapted to be connected to processor 107A, and wherein the slot identifier 111A enables processor 107A to determine which slot of the plurality of slots 102A-102D the power module 106A is coupled to. Further shown, slot 102A in the plurality of slots 102A-102D comprises an electrical connector 105A to enable electrical connections from the processor 107A to the at least one signal conductors 109 and 110, and to the slot identifier 111A.

Figure 2:
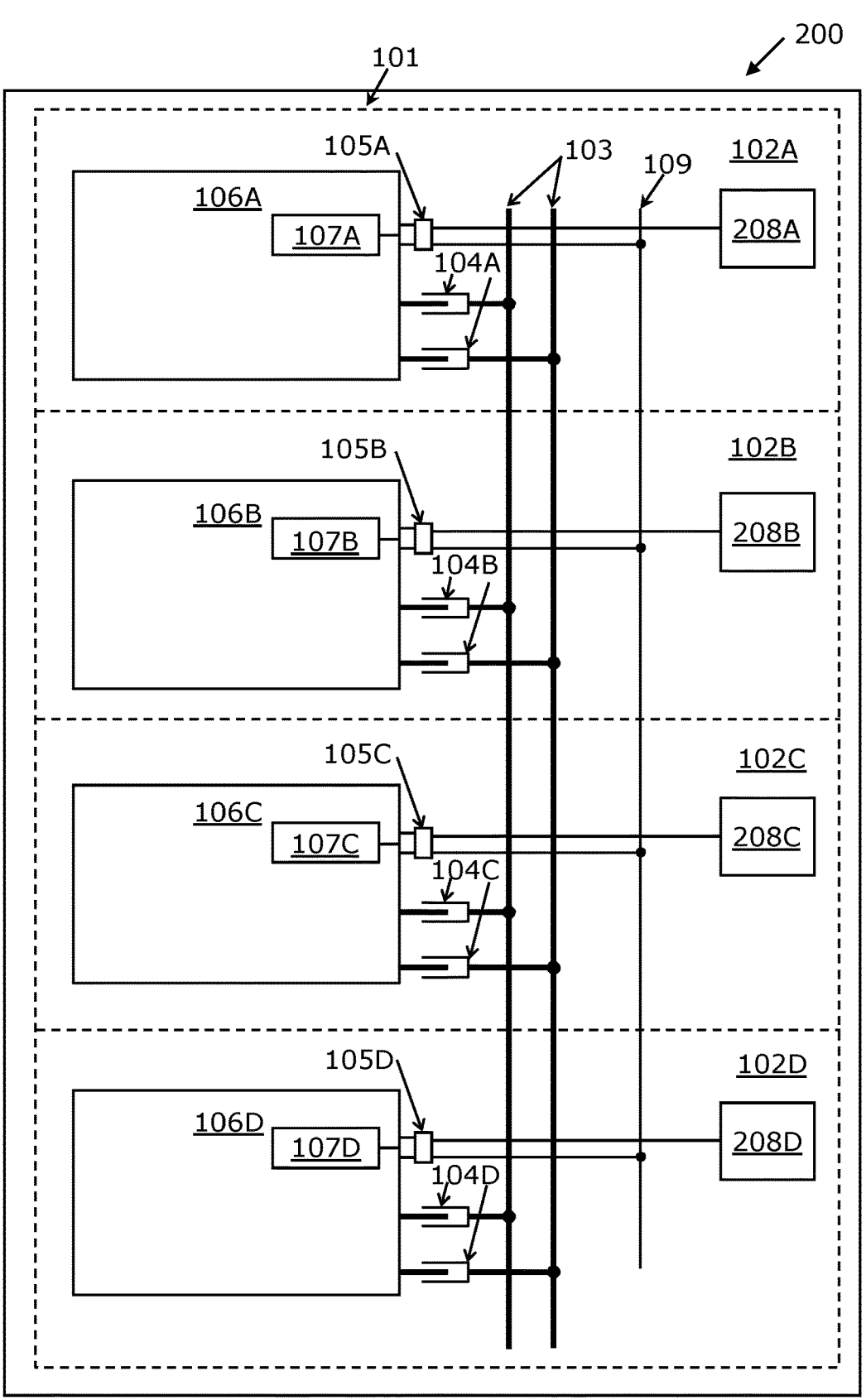
FIG. 2 is an exemplary illustration of a modular power system, in accordance with another embodiment of the present disclosure.

FIG. 2 is an exemplary illustration of a modular power system 200. in accordance with another embodiment of the present disclosure. As shown, the modular power system 200 comprises a high current backplane 101 for providing electrical connections, wherein the high current backplane 101 comprises a plurality of slots 102A-102D configured to receive a plurality of power modules 106A-106D. wherein each power module of the plurality of power modules 106A-106D is removably coupled to a slot of the plurality of slots 102A-102D. Further shown. the high current backplane 101 comprises at least two high current conductors 103. interconnecting each slot of the plurality of slots 102A-102D. Further shown. the high current backplane 101 comprises a plurality of connectors 104A-104D from power modules 106A-106D to the at least two high current conductors 103. Further shown. slot 102A comprises a memory device 208A. wherein memory device 208A is configured to store configuration data and optionally slot identification data for power module 106A. and wherein power module 106A comprises a processor 107A, wherein processor 107A is operatively coupled with memory device 208A. Further. processor 107A is adapted to employ the configuration data contained in memory device 208A for a desired operation of the power module 106A, and to employ the slot identification data contained in memory device 208A to determine which slot of the plurality of slots 102A-102D the power module 106A is coupled to. Further shown, the high current backplane 101 comprises at least one first electrical signal conductor 109 to enable electrical signals to be communicated to and from each power module of the plurality of power modules 106A-106D. Further shown, slot 102A comprises at least one electrical signal conductor 210A for connecting the memory device 208A to the processor 107A. Further shown, slot 102A comprises an electrical connector 105A to enable electrical connections from the processor 107A to the at least one signal conductor 109 and the at least one signal conductor 210A.

Figure 3:
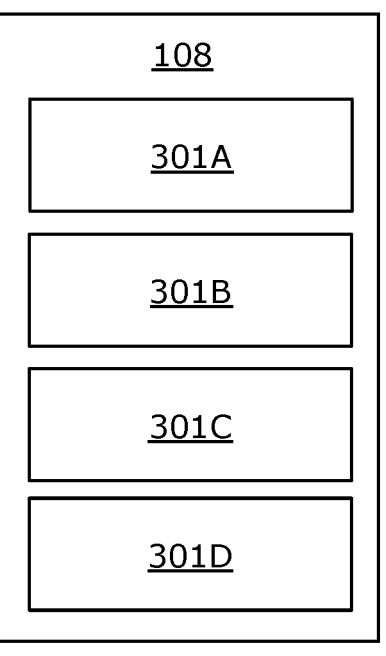
FIG. 3 is a block diagram of the memory device of FIG. 1, in accordance with an embodiment of the present disclosure.

FIG. 3 is a block diagram of the memory device 108 of FIG. 1, in accordance with an embodiment of the present disclosure. As shown, the at least one memory device 108 is configured to store configuration data and, optionally, slot compatibility data 301A. 301B, 301C, 301D for each of the plurality of power modules 106A-106D. Thus, the at least one memory device 108 comprises multiple types of configuration data and, optionally, slot compatibility data 301A, 301B, 301C, 301D to enable a variety of power modules to be plugged into the plurality of slots 102A-102D.

Figure 4:
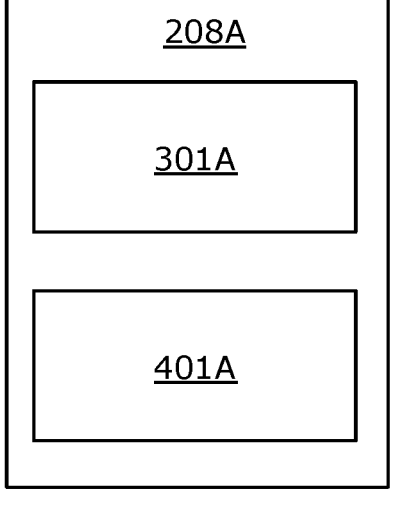
FIG. 4 is a block diagram of the memory device of FIG. 2, in accordance with another embodiment of the present disclosure.

FIG. 4 is a block diagram of memory device 208A of FIG. 2, in accordance with another embodiment of the present disclosure. As shown, the memory device 208A is configured to store configuration data and, optionally, slot compatibility data 301A for the power module 106A that is coupled to slot 102A. Moreover, as shown, memory device 208A comprises a slot identifier 401A, wherein the slot identifier 401A is configured to identify to the processor 107A contained in the power module 106A that the power module 106A is coupled to slot 102A.

Figure 5:
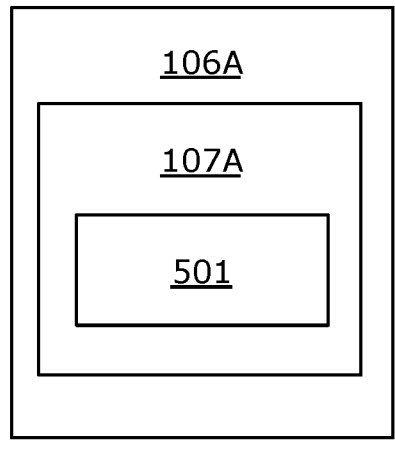
FIG. 5 is a block diagram of one of the set of power modules of FIG. 1, in accordance with an embodiment of the present disclosure.

FIG. 5 is a block diagram of power module 106A of FIG. 1 or FIG. 2 in accordance with an embodiment of the present disclosure. As shown, the power module 106A comprises a processor 107A as earlier illustrated in FIGS. 1 and 2. Herein, the processor 107A comprises an error generation module 501 operable to generate an error alert when the power module 106A is not connected to a compatible slot. Typically, the processor 107A is configured to access the configuration data and slot compatibility data 301A of the associated memory device 108 or 208A to determine if the power module 106A is coupled to a compatible slot by at least checking whether the configuration data is intended for the type of power module that power module 106A is, and checking whether slot 102A is of a type that is suitable for the type of power module that power module 106A is.

Figure 6:
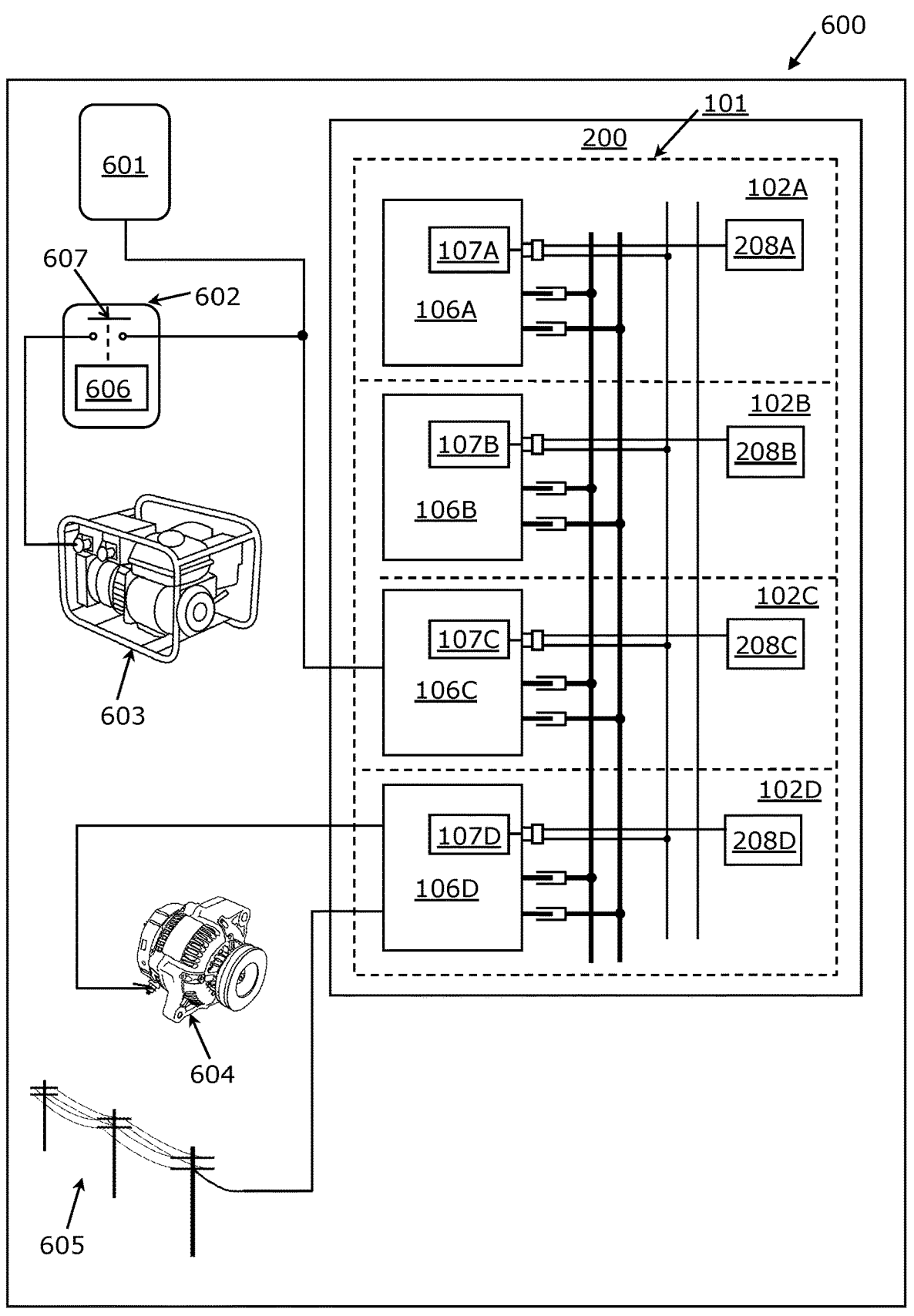
FIG. 6 is a detailed system diagram of a modular power system, in accordance with various embodiments of the present disclosure.

FIG. 6 is a detailed system diagram of a modular power system 600. in accordance with various embodiments of the present disclosure. The modular power system 600 comprises a high current backplane 101 (as shown in FIG. 2) for providing electrical connections. The high current backplane 101 comprises a plurality of slots 102A-102D configured to receive a plurality of power modules 106A-106D (as shown in FIG. 2), wherein each power module of the plurality of power modules 106A-106D is removably coupled to a slot of the plurality of slots 102A-102D. Herein. the plurality of power modules 106A-106D comprise battery modules 106A and 106B. an inverter module 106C and a charging module 106D. As shown. apart from the components of the modular power system 200. the modular power system 600 comprises an AC distribution panel 601 configured to distribute the AC power to various other electrical systems and appliances (not shown). Moreover, the modular power system 600 comprises a generator synchronization unit 602. connected to the inverter module 106C. to synchronize the AC voltage output of the inverter module 106C with the AC voltage output of the generator 603. Herein. the generator synchronization unit 602 comprises a synchronization controller 606 to control one or more electric switches 607 so that the AC voltage outputs of the generator 603 and the inverter module 106C are connected to each other only when they are in phase with each other. and. once connected, the inverter module 106C and the generator 603 can both supply power to the electrical systems and appliances connected to the AC distribution panel 601. Further. if the electrical power required by the electrical systems and appliances connected to the AC distribution panel 601 is less than the maximum power that the generator 603 can supply. the inverter module 106C can draw the excess power from the generator 603 and use it to charge the battery modules 106A and 106B. Further, the modular power system 600 comprises an alternator 604 coupled to the charging module 106D, wherein the alternator 604 is driven by an internal combustion engine (not shown) so that when the internal combustion engine is running the DC current generated by the alternator 604 can flow through the charging module 106D to charge the battery modules 106A and 106B. In addition. the modular power system 600 comprises an electrical grid connection 605 so that when an electrical grid connection 605 is available. the charging module 106D can draw power from the electrical grid connection 605 and use this to charge the battery modules 106A and 106B.

Figure 7:
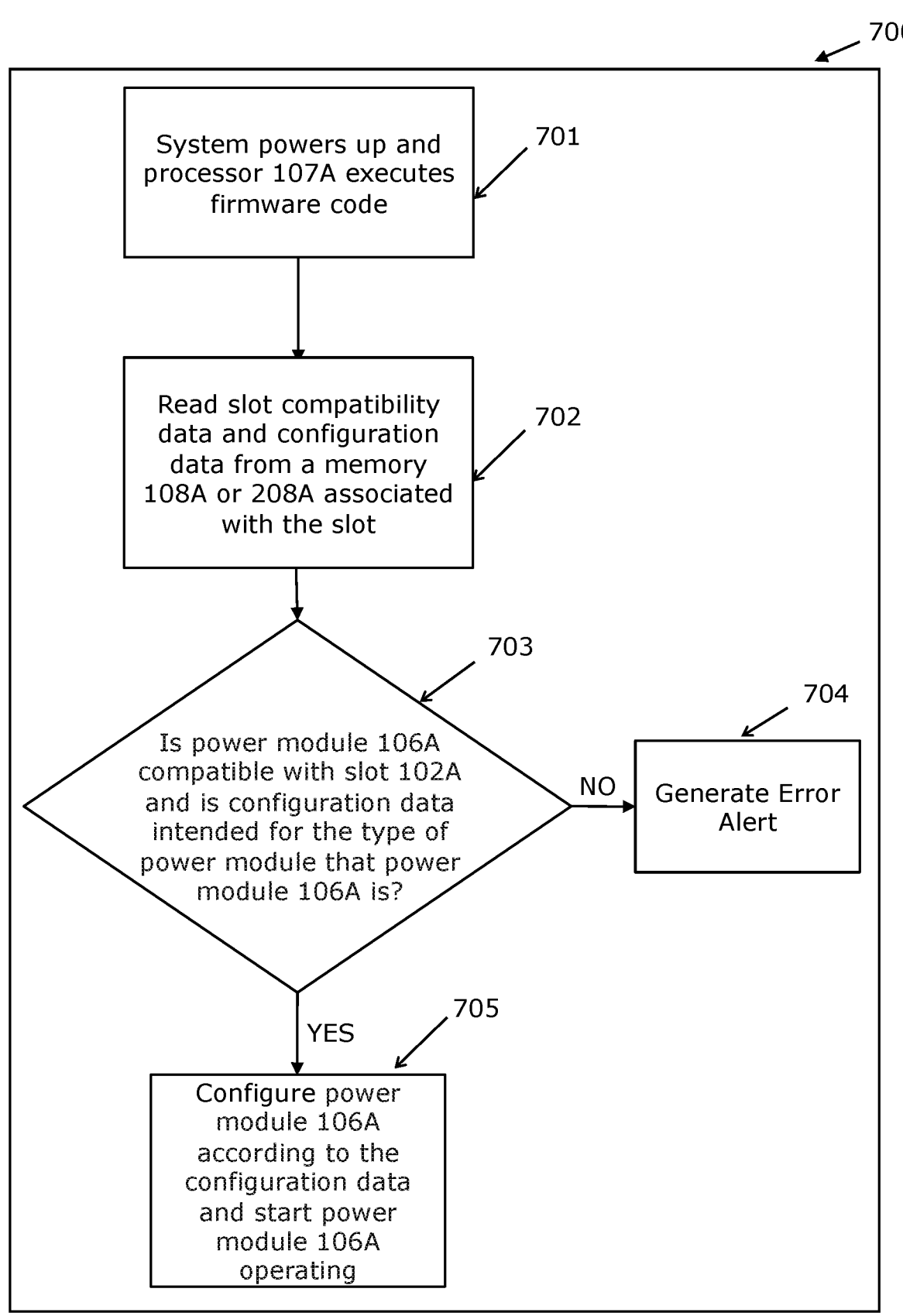
FIG. 7 is a flow chart illustrating verification of compatibility of a power module, in accordance with another embodiment of the present disclosure.

FIG. 7 is a flow chart 700 in accordance with another embodiment of the present disclosure illustrating steps performed by the error generation module 501 located in processors 107A-107D during verification of slot compatibility and configuration data suitability. As shown, the processor 107A is configured to execute the firmware code of the error generation module 501 so as to verify whether the power module 106A containing the processor 107A is coupled to a compatible slot or not.

At step 701, the system 100 powers up and the processor 107A contained in the power module 106A begins executing its firmware code.

At step 702, the processor 107A reads the slot compatibility data and the configuration data 301A from the at least one memory device 108 or the memory device 208A.

At step 703, the processor 107A determines whether the power module 106A is connected to a compatible slot based on the slot compatibility data contained in 301A, and also determines whether the configuration data in 301A is intended for the type of power module that power module 106A is. If the slot 102A is compatible with power module 106A and the configuration data in 301A is intended for the type of power module that power module 106A is, then the processor 107A will continue execution at step 705. If the slot 102A is not compatible with power module 106A and/or the configuration data in 301A is not intended for the type of power module that power module 106A is, then processor 107A will continue execution at step 704.

At step 704, the processor 107A generates an error alert indicating that either the power module 106A is not coupled to a compatible slot based on the slot compatibility data in 301A and/or the configuration data in 301A, or is not intended for the type of power module that power module 106A is. In an embodiment, the processor 107A of the power module 106A generates an error alert, wherein the error alert is in the form of an audible cue, visual cue, or both.

At step 705, the processor 107A uses the configuration data 301A to set the operational parameters of the power module 106A and then starts power module 106A operation.

Modifications to embodiments of the present disclosure described in the foregoing are possible without departing from the scope of the present disclosure as defined by the accompanying claims. Expressions such as "including", "comprising", "incorporating", "have", "is" used to describe and claim the present disclosure are intended to be construed in a non-exclusive manner, namely allowing for items, components or elements not explicitly described also to be present. Reference to the singular is also to be construed to relate to the plural.

The invention claimed is:

1. A modular power system comprising:
a high current backplane for providing electrical connections, the high current backplane comprising:
a plurality of slots, each of the slots comprises:
a connector configured to receive a power module from a plurality of power modules, and wherein the power module can be removably coupled to the connector; and
at least one memory device configured to store information, the information comprises configuration data for one or more of the plurality of power modules, the configuration data including data of a specific type of power module or for different types of the power modules,
wherein each power module of the plurality of power modules comprises a processor that directly accesses the configuration data from the at least one memory device to control operation of the power module.

2. The modular power system according to claim 1, wherein each of the slots comprises one of the at least one memory device.

3. The modular power system according to claim 2, wherein at least one of the at least one memory device comprises at least a slot identifier.

4. The modular power system according to claim 1, wherein the information of the at least one memory device further comprises a slot compatibility data, and wherein each processor is configured to determine whether the power module containing the processor is coupled to a compatible one of the slots based on the slot compatibility data.

5. The modular power system according to claim 4, wherein each processor is configured to generate an error alert when the power module containing the processor is not coupled to the compatible one of the slots.

6. The modular power system according to claim 1, wherein the processor is configured to generate an error alert when the configuration data in the at least one memory device that is intended for the slot that the power module containing the processor is coupled to is not suitable for the specific type or at least one of the different types of the power module containing the processor.

7. The modular power system according to claim 1, wherein the plurality of power modules coupled to the plurality of slots comprises one or more battery modules.

8. The modular power system according to claim 1, wherein the high current backplane further comprises a plurality of connectors including the connector, each of the connectors configured to connect to a mating connector on the power module of the plurality of power modules and enabling electrical signals to be communicated to and from each of the plurality of power modules.

9. The modular power system according to claim 8, wherein the plurality of connectors is further configured to enable the power module of the plurality of power modules coupled to a slot of the plurality of slots to communicate with at least another of the plurality of power modules coupled to at least another of the plurality of slots.

10. The modular power system according to claim 8, wherein the plurality of connectors is further configured to enable the processor contained in each of the plurality of power modules to directly access the at least one memory device.

11. The modular power system according to claim 8, wherein the connector and the mating connector form a blind-mate connector system, one or both of the connector or the mating connector comprises one or more angled guides adapted to align the connector with respect to the mating connector or vice versa, as the power module is inserted into the high current backplane.

12. The modular power system according to claim 2, wherein the information of the at least one memory device further comprises a slot compatibility data, and wherein each processor is configured to determine whether the power module containing the processor is coupled to a compatible one of the slots based on the slot compatibility data.

13. The modular power system according to claim 12, wherein each processor is configured to generate an error alert when the power module containing the processor is not coupled to the compatible one of the slots.

14. The modular power system according to claim 3, wherein the information of the at least one memory device further comprises a slot compatibility data, and wherein each processor is configured to determine whether the power module containing the processor is coupled to a compatible one of the slots based on the slot compatibility data.

15. The modular power system according to claim 14, wherein each processor is configured to generate an error alert when the power module containing the processor is not coupled to the compatible one of the slots.

16. The modular power system according to claim 2, wherein the processor is configured to generate an error alert when the configuration data in the at least one memory device that is intended for the slot that the power module containing the processor is coupled to is not suitable for the specific type or at least one of the different types of the power module containing the processor.

17. The modular power system according to claim 3, wherein the processor is configured to generate an error alert when the configuration data in the at least one memory device that is intended for the slot that the power module containing the processor is coupled to is not suitable for the specific type or at least one of the different types of the power module containing the processor.

18. The modular power system according to claim 9, wherein the plurality of connectors is further configured to enable the processor contained in each of the plurality of power modules to directly access the at least one memory device.

19. The modular power system according to claim 9, wherein the connector and the mating connector form a blind-mate connector system, one or both of the connector or the mating connector comprises one or more angled guides adapted to align the connector with respect to the mating connector or vice versa, as the power module is inserted into the high current backplane.

20. The modular power system according to claim 10, wherein the connector and the mating connector form a blind-mate connector system, one or both of the connector or the mating connector comprises one or more angled guides adapted to align the connector with respect to the mating connector or vice versa, as the power module is inserted into the high current backplane.

\* \* \* \* \*